(12) United States Patent
Chu et al.

(10) Patent No.: US 7,299,436 B2
(45) Date of Patent: Nov. 20, 2007

(54) SYSTEM AND METHOD FOR ACCURATELY MODELING AN ASYNCHRONOUS INTERFACE USING EXPANDED LOGIC ELEMENTS

(75) Inventors: Bing-Lun Chu, Austin, TX (US); Yee Ja, Round Rock, TX (US); Bradley S. Nelson, Austin, TX (US); Wolfgang Roesner, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 11/054,880

(22) Filed: Feb. 10, 2005

(65) Prior Publication Data

US 2006/0190858 A1    Aug. 24, 2006

(51) Int. Cl.
G06F 17/50    (2006.01)
G06F 9/45    (2006.01)
(52) U.S. Cl. .................................. 716/6; 716/3; 716/5
(58) Field of Classification Search ................ 716/1–6, 716/16–18; 703/1, 14–23
See application file for complete search history.

(56) References Cited

U.S. PATENT DOCUMENTS

| | | | |
|---|---|---|---|
| 4,979,190 A | | 12/1990 | Sager et al. |
| 5,469,367 A | * | 11/1995 | Puri et al. ...................... 716/18 |
| 5,493,505 A | * | 2/1996 | Banerjee et al. ............... 716/18 |
| 5,592,685 A | * | 1/1997 | Pawlowski .................... 710/62 |
| 5,748,487 A | * | 5/1998 | Sawasaki et al. .............. 716/1 |
| 5,790,830 A | | 8/1998 | Segal |
| 6,226,774 B1 | * | 5/2001 | Sawasaki et al. .............. 716/1 |
| 6,321,184 B1 | | 11/2001 | Baumgartner et al. |
| 6,321,366 B1 | * | 11/2001 | Tseng et al. .................... 716/6 |
| 6,324,679 B1 | * | 11/2001 | Raghunathan et al. ........ 716/18 |
| 6,785,873 B1 | | 8/2004 | Tseng |
| 6,892,314 B2 | | 5/2005 | Chen |
| 6,956,788 B1 | | 10/2005 | Nguyen et al. |
| 6,957,403 B2 | | 10/2005 | Wang et al. |
| 7,089,818 B2 | | 8/2006 | Bair et al. |
| 2005/0069068 A1 | | 3/2005 | Gundurao et al. |

OTHER PUBLICATIONS

Unger, Hazard, Critical Races, and Metastability, Jun. 1995, IEEE, vol. 44, No. 6, pp. 754-767.*
Lavagno et al., Algorithms for synthesis of hazard-free asynchronous circuit, 1991, ACM, p. 302-308.*
Shieh et al., Fault effects in asynchronous sequential logic circuits, Nov. 1993, IEEE,vol. 140, No. 6, pp. 327-332.*
Synthesis of Hazard-Free Multi-level Logic under Multiple-Input Change from Binary Decison Diagrams, 1994, IEEE/ACM, pp. 542-549.*
U.S. Appl. No. 10/841,729, filed May 7, 2004.

* cited by examiner

Primary Examiner—Jack Chiang
Assistant Examiner—Nghia M. Doan
(74) Attorney, Agent, or Firm—Stephen J. Walder, Jr.; Casimer K. Salys

(57) ABSTRACT

A system and method for accurately modeling an asynchronous interface using expanded logic elements are provided. With the apparatus and method, the logic of an asynchronous interface is reduced to primitive logic elements. These primitive logic elements are expanded by the mechanisms of the present invention to take into consideration whether or not the primitive logic elements themselves may be experiencing a switching or glitch hazard and whether or not the inputs to the primitive logic elements may be based on a switching or glitch hazard from another primitive logic element in the asynchronous interface logic. These expanded logic elements are used in an integrated circuit design to replace the original primitive logic elements in the design. The asynchronous interface may then be simulated with the expanded logic elements providing outputs indicative of whether the actual data output of the expanded logic elements is deterministic or not.

18 Claims, 7 Drawing Sheets

| A | B | C |
|---|---|---|
| 0 | 0 | 0 |
| 0 | 1 | 0 |
| 1 | 0 | 0 |
| 1 | 1 | 1 |

FIG. 5 — EXPANDED TRUTH TABLE FOR OR GATE

| T = N−1 | | C = F(A,B) | T = N | | C = F(A,B) | SWITCHING/ GLITCH HAZARD X = F(A,B,T) |
|---|---|---|---|---|---|---|
| A | B | | A | B | | |
| 0 | 0 | 0 | 0 | 0 | 0 | 0 |
| 0 | 0 | 0 | 0 | 1 | 1 | 1 |
| 0 | 0 | 0 | 1 | 0 | 1 | 1 |
| 0 | 0 | 0 | 1 | 1 | 1 | 1 |
| 0 | 1 | 1 | 0 | 0 | 0 | 1 |
| 0 | 1 | 1 | 0 | 1 | 1 | 0 |
| 0 | 1 | 1 | 1 | 0 | 1 | 1 |
| 0 | 1 | 1 | 1 | 1 | 1 | 0 |
| 1 | 0 | 1 | 0 | 0 | 0 | 1 |
| 1 | 0 | 1 | 0 | 1 | 1 | 1 |
| 1 | 0 | 1 | 1 | 0 | 1 | 0 |
| 1 | 0 | 1 | 1 | 1 | 1 | 0 |
| 1 | 1 | 1 | 0 | 0 | 0 | 1 |
| 1 | 1 | 1 | 0 | 1 | 1 | 0 |
| 1 | 1 | 1 | 1 | 0 | 1 | 0 |
| 1 | 1 | 1 | 1 | 1 | 1 | 0 |

FIG. 4 — EXPANDED TRUTH TABLE FOR AND GATE (400)

| T = N−1 | | C = F(A,B) | T = N | | C = F(A,B) | SWITCHING/ GLITCH HAZARD X = F(A,B,T) |
|---|---|---|---|---|---|---|
| A | B | | A | B | | |
| 0 | 0 | 0 | 0 | 0 | 0 | 0 |
| 0 | 0 | 0 | 0 | 1 | 0 | 0 |
| 0 | 0 | 0 | 1 | 0 | 0 | 0 |
| 0 | 0 | 0 | 1 | 1 | 1 | 1 |
| 0 | 1 | 0 | 0 | 0 | 0 | 0 |
| 0 | 1 | 0 | 0 | 1 | 0 | 0 |
| 0 | 1 | 0 | 1 | 0 | 0 | 1 |
| 0 | 1 | 0 | 1 | 1 | 1 | 1 |
| 1 | 0 | 0 | 0 | 0 | 0 | 0 |
| 1 | 0 | 0 | 0 | 1 | 0 | 1 |
| 1 | 0 | 0 | 1 | 0 | 0 | 0 |
| 1 | 0 | 0 | 1 | 1 | 1 | 1 |
| 1 | 1 | 1 | 0 | 0 | 0 | 1 |
| 1 | 1 | 1 | 0 | 1 | 0 | 1 |
| 1 | 1 | 1 | 1 | 0 | 0 | 1 |
| 1 | 1 | 1 | 1 | 1 | 1 | 0 |

← 410  ← 420  ← 430

| | T = N | | | Y = |
|---|---|---|---|---|
| A | A' | B | B' | F(A, A', B, B') |
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 0 |
| 0 | 1 | 1 | 0 | 1 |
| 0 | 1 | 1 | 1 | 1 |
| 1 | 0 | 0 | 0 | 0 |
| 1 | 0 | 0 | 1 | 1 |
| 1 | 0 | 1 | 0 | 0 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

800

700

EXPANDED TRUTH TABLE FOR XOR GATE

| T = N-1 | | C = F(A,B) | T = N | | C = F(A,B) | SWITCHING/ GLITCH HAZARD X = F(A, B, T) |
|---|---|---|---|---|---|---|
| A | B | | A | B | | |
| 0 | 0 | 0 | 0 | 0 | 0 | 0 |
| 0 | 0 | 0 | 0 | 1 | 1 | 1 |
| 0 | 0 | 0 | 1 | 0 | 1 | 1 |
| 0 | 0 | 0 | 1 | 1 | 0 | 1 |
| 0 | 1 | 1 | 0 | 0 | 0 | 1 |
| 0 | 1 | 1 | 0 | 1 | 1 | 0 |
| 0 | 1 | 1 | 1 | 0 | 1 | 1 |
| 0 | 1 | 1 | 1 | 1 | 0 | 1 |
| 1 | 0 | 1 | 0 | 0 | 0 | 1 |
| 1 | 0 | 1 | 0 | 1 | 1 | 1 |
| 1 | 0 | 1 | 1 | 0 | 1 | 0 |
| 1 | 0 | 1 | 1 | 1 | 0 | 1 |
| 1 | 1 | 0 | 0 | 0 | 0 | 1 |
| 1 | 1 | 0 | 0 | 1 | 1 | 1 |
| 1 | 1 | 0 | 1 | 0 | 1 | 1 |
| 1 | 1 | 0 | 1 | 1 | 0 | 0 |

FIG. 9

FULLY EXPANDED TRUTH TABLE FOR OR GATE

| T = N-1 | | | T = N | | | SWITCHING/ GLITCH HAZARD | T = N | | | | |
|---|---|---|---|---|---|---|---|---|---|---|---|
| A | B | C = F(A,B) | A | B | C = F(A,B) | X = F(A,B,T) | A | A' | B | B' | Y = F(A, A', B, B') |
| 0 | 0 | 0 | 0 | 0 | 0 | 0 | 0 | 0 | 0 | 0 | 0 |
| 0 | 0 | 0 | 0 | 1 | 1 | 1 | 0 | 0 | 0 | 1 | 1 |
| 0 | 0 | 0 | 1 | 0 | 1 | 1 | 0 | 1 | 0 | 0 | 1 |
| 0 | 0 | 0 | 1 | 1 | 1 | 1 | 0 | 1 | 0 | 1 | 1 |
| 0 | 1 | 1 | 0 | 0 | 0 | 1 | 0 | 0 | 1 | 0 | 0 |
| 0 | 1 | 1 | 0 | 1 | 1 | 0 | 0 | 0 | 1 | 1 | 1 |
| 0 | 1 | 1 | 1 | 0 | 1 | 1 | 0 | 1 | 1 | 0 | 0 |
| 0 | 1 | 1 | 1 | 1 | 1 | 0 | 0 | 1 | 1 | 1 | 1 |
| 1 | 0 | 1 | 0 | 0 | 0 | 1 | 1 | 0 | 0 | 0 | 0 |
| 1 | 0 | 1 | 0 | 1 | 1 | 1 | 1 | 0 | 0 | 1 | 1 |
| 1 | 0 | 1 | 1 | 0 | 1 | 0 | 1 | 1 | 0 | 0 | 0 |
| 1 | 0 | 1 | 1 | 1 | 1 | 0 | 1 | 1 | 0 | 1 | 1 |
| 1 | 1 | 1 | 0 | 0 | 0 | 1 | 1 | 0 | 1 | 0 | 0 |
| 1 | 1 | 1 | 0 | 1 | 1 | 0 | 1 | 0 | 1 | 1 | 1 |
| 1 | 1 | 1 | 1 | 0 | 1 | 0 | 1 | 1 | 1 | 0 | 0 |
| 1 | 1 | 1 | 1 | 1 | 1 | 0 | 1 | 1 | 1 | 1 | 1 |

FIG. 10

FULLY EXPANDED TRUTH TABLE FOR XOR GATE

| T = N−1 | | | T = N | | | SWITCHING/ GLITCH HAZARD | T = N | | | | |
|---|---|---|---|---|---|---|---|---|---|---|---|
| A | B | C = F(A,B) | A | B | C = F(A,B) | X = F(A, B, T) | A | A' | B | B' | Y = F(A, A', B, B') |
| 0 | 0 | 0 | 0 | 0 | 0 | 0 | 0 | 0 | 0 | 0 | 0 |
| 0 | 0 | 0 | 0 | 1 | 1 | 1 | 0 | 0 | 0 | 1 | 1 |
| 0 | 0 | 0 | 1 | 0 | 1 | 1 | 0 | 1 | 0 | 0 | 1 |
| 0 | 0 | 0 | 1 | 1 | 0 | 0 | 0 | 1 | 0 | 1 | 1 |
| 0 | 1 | 1 | 0 | 0 | 0 | 1 | 0 | 0 | 1 | 0 | 0 |
| 0 | 1 | 1 | 0 | 1 | 1 | 1 | 0 | 0 | 1 | 1 | 1 |
| 0 | 1 | 1 | 1 | 0 | 1 | 0 | 0 | 1 | 1 | 0 | 1 |
| 0 | 1 | 1 | 1 | 1 | 0 | 1 | 0 | 1 | 1 | 1 | 1 |
| 1 | 0 | 1 | 0 | 0 | 0 | 1 | 1 | 0 | 0 | 0 | 0 |
| 1 | 0 | 1 | 0 | 1 | 1 | 0 | 1 | 0 | 0 | 1 | 1 |
| 1 | 0 | 1 | 1 | 0 | 1 | 1 | 1 | 1 | 0 | 0 | 1 |
| 1 | 0 | 1 | 1 | 1 | 0 | 1 | 1 | 1 | 0 | 1 | 1 |
| 1 | 1 | 0 | 0 | 0 | 0 | 1 | 1 | 0 | 1 | 0 | 0 |
| 1 | 1 | 0 | 0 | 1 | 1 | 1 | 1 | 0 | 1 | 1 | 1 |
| 1 | 1 | 0 | 1 | 0 | 1 | 1 | 1 | 1 | 1 | 0 | 1 |
| 1 | 1 | 0 | 1 | 1 | 0 | 0 | 1 | 1 | 1 | 1 | 1 |

SYSTEM AND METHOD FOR ACCURATELY MODELING AN ASYNCHRONOUS INTERFACE USING EXPANDED LOGIC ELEMENTS

RELATED APPLICATION

The present application is related to co-pending and commonly assigned U.S. patent application Ser. No. 10/841,729, entitled "Method and Program Product for Modeling Behavior of Asynchronous Clocks in a System Having Multiple Clocks," filed on May 7, 2004, which is hereby incorporated by reference.

BACKGROUND OF THE INVENTION

1. Technical Field

The present invention relates generally to an improved data processing system and method. More specifically, the present invention provides a system and method for accurately modeling an asynchronous interface using expanded logic elements.

2. Description of Related Art

An asynchronous interface is an interface between two independent synchronous clock domains which must communicate with one another. These clock domains may result from circuit elements being clocked by clocks that run at different clock speeds, clock domains clocked at the same frequency but having different clock sources, a single clock source having a clock distribution whose transmission delays are not guaranteed to be identical, and the like. Examples of asynchronous interfaces include asynchronous memory interfaces, asynchronous bus interfaces, and the like. Asynchronous interfaces are being used more often in today's computing technologies since it is often the case that one component operates at a first clock speed while another component, with which data communication is necessary, operates at a different clock speed.

An example block diagram of an asynchronous interface is shown in FIG. 1. As shown, the asynchronous interface typically includes a source element 110 operating in a first synchronous clock domain clk1 which must communicate with a sink element 130 operating in a second synchronous clock domain clk2. Logic 120 is provided as a means for communicating between the two clock domains clk1 and clk2 and constitutes the asynchronous interface between these two clock domains. The logic 120 may be very complex.

During design of such asynchronous interfaces, it is important to be able to verify the operation of these interfaces. There are five conditions that exist in asynchronous interfaces that make verification difficult. These five conditions include clock skew, combinatorial switching hazards, combinatorial glitch hazards, asynchronous latch updates (sometimes referred to as propagation delay), and meta-stability. Clock skew is the time differential between the latest a rising clock edge can occur and the earliest a rising clock edge can occur during one clock period. Because of the differences in clocks of an asynchronous interface, clock skew of each of these clocks, and a potential differential in propagation delay from source to sink, it is possible for one input signal to arrive sooner or later than another input signal to the logic of the asynchronous interface. This leads to the occurrence of combinatorial glitch and switching hazards. Moreover, combinatorial logic may also be sourced by multiple asynchronous clock domains and each transition could independently cause a switch and glitch hazard.

Combinatorial glitch hazards may be generated when one input to the logic of the asynchronous interface transitions faster or sooner than another input to the logic. Combinational switching hazards may be generated when one input is maintained at its current state while another input transitions to another state. If the other input transitions too slowly, the output of the logic may not be the intended output and thus, a switching hazard occurs. These hazards lead to asynchronous latch updates which cause the wrong output signal from the logic gates to be latched into the sink latches.

The difference in clocks and clock skew also leads to meta-stability problems. A meta-stable state is a state that exists between either valid digital logic state. Thus, there is a time period in which the state of the logic is uncertain. The clock, and data transitions can and will occur at any point in time. The meta-stability window is the period of time the sink latch can 'bounce' between logical values.

Historically, verification engineers did not have a method of verifying that the design did not have errors due to these conditions. Some methods attempt to classify asynchronous crossing, i.e. asynchronous interface, designs into a pattern of a known standard design template. However, there are many cases where the designs go outside the traditional templates and allow for protocol violations to occur. When such cases arise, the design may ignore the results of the asynchronous crossings, i.e. the asynchronous interface, at some point later in the design, thereby leading to incorrect results.

Thus, it would be beneficial to have a system and method for modeling asynchronous interfaces accurately such that the problems associated with clock skew, glitch hazards, switching hazards, asynchronous latch updates, and met-stability are accounted for in order to verify an asynchronous interface design.

SUMMARY OF THE INVENTION

As discussed above, the present invention provides a system and method for accurately modeling an asynchronous interface using expanded logic elements. With the present invention, the logic of an asynchronous interface is reduced to primitive logic elements. These primitive logic elements are expanded by the mechanisms of the present invention to take into consideration whether or not the primitive logic elements themselves may be experiencing a switching or glitch hazard and whether or not the inputs to the primitive logic elements may be based on a switching or glitch hazard from another primitive logic element in the asynchronous interface logic.

These expanded logic elements are used in an integrated circuit design to replace the original primitive logic elements in the design. The asynchronous interface may then be simulated with the expanded logic elements providing outputs indicative of whether the actual data output of the expanded logic elements is deterministic or not. In addition, based on whether or not the actual data output is deterministic or not, the data output may be replaced with another value indicative of the occurrence of a glitch or switching hazard.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4 is an exemplary diagram illustrating an expanded truth table for an AND gate identifying states in which switching/glitch hazards may occur;

FIG. 5 is an exemplary diagram illustrating an expanded truth table for an OR gate identifying states in which switching/glitch hazards may occur;

FIG. 9 is an exemplary diagram illustrating a fully expanded truth table for an expanded OR gate in accordance with an exemplary embodiment of the present invention;

FIG. 10 is an exemplary diagram illustrating a fully expanded truth table for an expanded XOR gate in accordance with an exemplary embodiment of the present invention;

DETAILED DESCRIPTION OF THE PREFERRED EMBODIMENT

Figure 2:
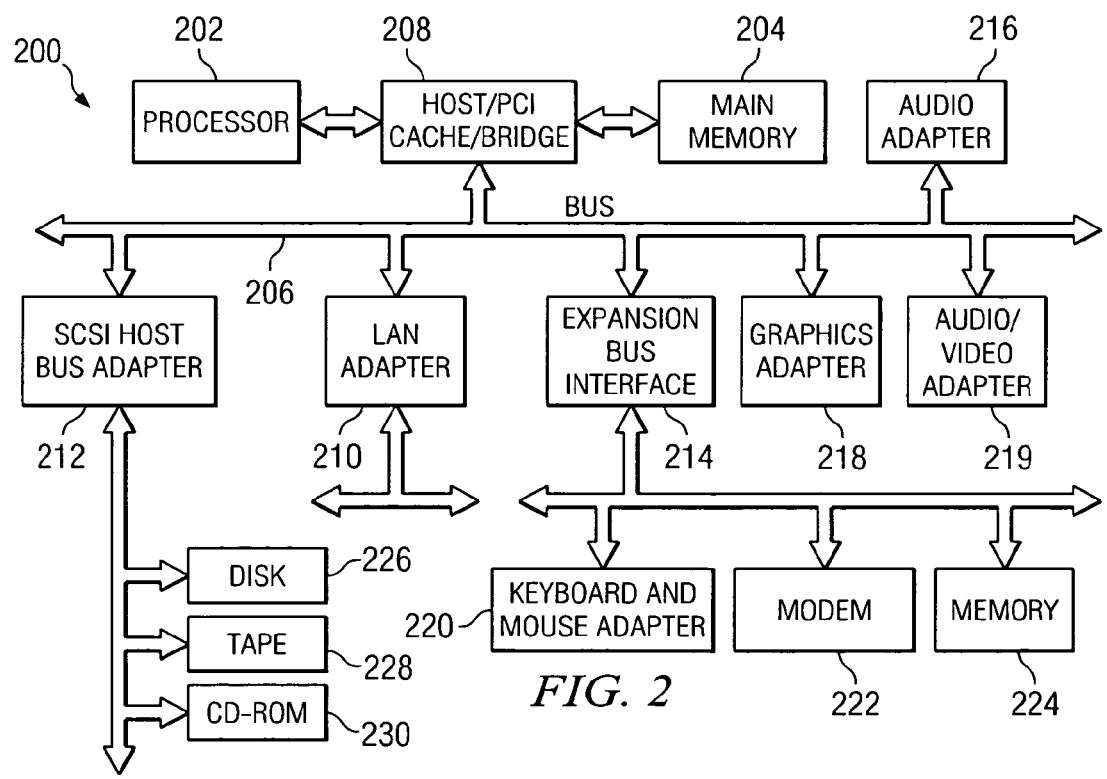
FIG. 2 is an exemplary block diagram of an exemplary data processing system in which aspects of the present invention may be implemented.

The present invention provides a system and method for accurately modeling an asynchronous interface. As such, the present invention may be used in conjunction with a computerized integrated circuit design system. FIG. 2 is provided as an example of a computerized data processing system in which aspects of the present invention may be implemented. It should be appreciated that FIG. 2 is only exemplary and is not intended to state or imply any limitation as to the type or configuration of the data processing systems that may be used to implement the system and method of the present invention. Many modifications to the data processing system shown in FIG. 2 may be made without departing from the spirit and scope of the present invention.

Figure 1:
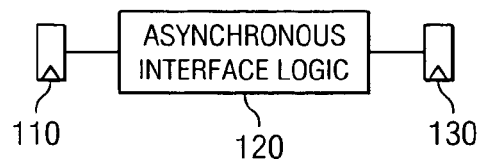
FIG. 1 is an exemplary block diagram illustrating an asynchronous interface.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in connectors. In the depicted example, local area network (LAN) adapter 210, small computer system interface (SCSI) host bus adapter 212, and expansion bus interface 214 are connected to PC local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows XP, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226-230.

The present invention provides a mechanism for modeling asynchronous interfaces. The mechanisms of the present invention may be implemented in a data processing system, such as that shown in FIG. 2 or the like, and may be implemented in association with an integrated circuit design system.

In an effort to reduce latencies associated with asynchronous hand shaking protocols, an increasing amount of combinatorial logic is being added to the interfaces. With the present invention, this combinatorial logic may be broken down into a set of primitive elements, i.e. AND, OR, XOR, and inverter gates. It is the representation of the primitive elements that the present invention expands to take into consideration the problem conditions discussed above. In this way, the modeling of the asynchronous interfaces is improved to provide information regarding the possible occurrences of glitch and switching hazards.

Figure 3:
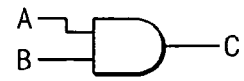
FIG. 3 is an exemplary diagram illustrating an AND gate and a standard truth table for the standard AND gate.

FIG. 3 is an exemplary diagram illustrating an AND gate and a standard truth table for the standard AND gate. As shown in FIG. 3, the AND gate has inputs A and B and output C. The corresponding truth table illustrates the possible combinations of inputs A and B to the AND gate with their corresponding outputs C. This level of analysis of the AND gate is generally sufficient for synchronous clock domains because the output value C is guaranteed to be correct by the synchronous timing analysis. However, when an AND gate is used in an asynchronous interface, the truth table shown in FIG. 3 does not always hold true due to the possibility of switching and glitch hazards.

FIG. 4 is an exemplary diagram illustrating an expanded truth table for an AND gate identifying states in which switching/glitch hazards may occur. The expanded truth table shown in FIG. 4 is used to identify the combinations of inputs A and B which may lead to a switching or glitch hazard due to the asynchronous nature of the inputs. In the expanded truth table of FIG. 4, t represents time, n is a sampling point, and X is a function that indicates when the output C can be received by an asynchronous sink as a non-deterministic value.

Column 410 of truth table 400 shows the possible inputs A, B and the corresponding output for a previous sampling point n−1. The combinations shown in column 410 correspond to the truth table shown in FIG. 3. Column 420 shows the possible transitions of the inputs and their corresponding outputs at a subsequent sampling point n. That is, from inputs of A=0, B=0, the possible transitions of the inputs include A=0, B=0; A=0, B=1; A=1, B=0; and A=1, B=1.

Glitch hazards occur when both inputs transition to a different state. That is, when both inputs transition from either a 0 to a 1 or from a 1 to a 0. Under such conditions, it is possible that one of the inputs may transition faster than the other input. For example, if the inputs at time t=n−1 are 0, 1, it is possible that input A may transition faster than input B resulting in a temporary state where both inputs are 1. With the AND gate, a state where both inputs are 1 results in the output C being 1. This is an erroneous output since the intended output is 0. Thus, under such circumstances a glitch hazard has occurred.

Switching hazards occur when one input remains at the same state while the other input transitions to a different state, wherein the combination of states results in the output being different. If the transitioning input transitions too slowly, it is possible for the transition to not be performed within the setup and hold timing requirements. As a result, the previous state may be maintained. For example, if the inputs at time t=n−1 are 0, 1 and input A is to transition to a value of 1 to generate an input state 1, 1, if the transition happens too slowly, the state 0, 1 may be maintained at time t=n. As a result, rather than the output C being a 1, the output C may be maintained as a 0.

The third column 430 of expanded truth table 400 identifies the combinations of inputs and their transitions that may give rise to either a switching or glitch hazard. Those rows of the expanded truth table 400 which have an X value of 1 identify the possible states that may give rise to a switching or glitch hazard. Thus, for example, when the inputs of the AND gate are 0, 1 and, in the next sampling point, are transitioned to 1, 0, since both inputs change value and if a glitch occurs, a different output than the desired output would be generated, the third column 430 identifies this transition as a possible source of a glitch hazard. Similarly, if the inputs at a first sampling point are 0, 1 and these inputs are to transition to 1, 1 in the next sampling point, and if the A input were to transition too slowly a different output from the desired output would be generated, this transition is identified as a possible source of a switching hazard.

Other transitions, such a transitioning from inputs of 0, 1 to 0, 0, do not represent a source of either a glitch hazard or a switching hazard since even if the inputs occur too fast or too slow relative to the other inputs, the output result would still be the same. That is, whether the inputs are 0, 1 or 0, 0, the output of the AND gate will still be a 0 and thus, whether or not the input transitions slowly or too fast, the correct result is achieved. It should be noted that each input that makes any transition during an initial time period in which the inputs are permitted to transition, i.e. the tAX time period discussed hereafter, is considered to be transitioning continuously during the total tAX time period.

Figures 6, 7, 8:
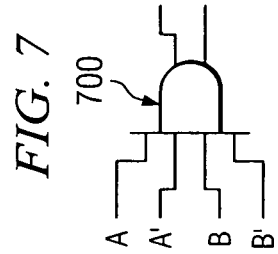
FIG. 6 is an exemplary diagram illustrating an expanded truth table for an XOR gate identifying states in which switching/glitch hazards may occur.
FIG. 7 is an exemplary diagram illustrating an expanded AND gate in accordance with an exemplary embodiment of the present invention.
FIG. 8 is an exemplary diagram illustrating a fully expanded truth table for the expanded AND gate illustrated in FIG. 7.

Similar expanded truth tables may be generated for each of the logic primitives OR, XOR, etc. FIG. 5 is an exemplary diagram illustrating an expanded truth table for an OR gate identifying states in which switching/glitch hazards may occur. FIG. 6 is an exemplary diagram illustrating an expanded truth table for an XOR gate identifying states in which switching/glitch hazards may occur. The truth tables illustrated in FIGS. 4-6 illustrate the conditions under which the logic gate itself generates either a glitch or switching hazard. However, since the logic gate will typically be implemented in combination with other logic gates. As a result, the combinatorial logic output of a logic gate may be affected by other logic gates that drive the inputs to that particular logic gate. Therefore, a new logic gate element and expanded truth table that takes into account the glitch and switching conditions of the logic gate and the potential glitch or switching hazard driven inputs to the logic gate.

FIG. 7 is an exemplary diagram illustrating an expanded AND gate in accordance with an exemplary embodiment of the present invention. As shown in FIG. 7, the expanded AND gate 700 includes the original inputs A and B and the original output C. In addition, inputs A' and B' and the additional output C' are provided as part of the expanded AND gate 700. Inputs A' and B' identify the inputs A and B which are being driven from a combinatorial switching or glitch hazard condition. Output C' identifies the output C that is propagating a logical value from a switching or glitch condition. The A' and B' inputs are essentially a mechanism for identifying whether the inputs A and B are deterministic, i.e. are the actual input values, or may be non-deterministic due to the inputs being driven by sources experiencing switching or glitch hazard conditions. If A' or B' has a 0 value, then the associated input A or B is deterministic. If A' or B' has a 1 value, then the associated input A or B may be driven by a glitch or switching hazard input and thus, are non-deterministic. Similarly, C' identifies whether or not the output C is deterministic or not. Thus, the inputs A', B' and the output C' are "guarantees" that the associated inputs/outputs A, B and C are deterministic.

FIG. 8 is an exemplary diagram illustrating a table for identifying when the output of the expanded gate in FIG. 7 is deterministic or not. The table 800 identifies the various combinations of A, A', B and B' along with a value Y which is indicative of whether or not the output of the logic gate is deterministic or not because its inputs are either deterministic or non-deterministic. When Y=1, the output C of the logic gate is non-deterministic and when Y=0, the output C of the logic gate is deterministic.

Thus, for example, if the input A is 0, A' is 0, B is 1 and B' is 1, the value for Y is 0. This is because A is guaranteed to be a 0, i.e. A' is 0 indicating that the value for A is deterministic. Since the logic gate 700 is an AND gate, as long as one input is known to be a 0, even though the other input is non-deterministic, the output will always be a 0. As a result, the output of the logic gate 700 with these inputs is a deterministic 0 value.

As a further example, if the inputs of the logic gate 700 are A=0, A'=1, B=1 and B'=0, then the Y value is 1 because the output of the logic gate 700 is non-deterministic. The output of logic gate 700 is non-deterministic because the input value of B is 1 and is deterministic but the input value of A is 0 and is non-deterministic. Thus, if A is actually 0, the output of the logic gate 700 is a 0. However, if A is actually a 1, the output of the logic gate 700 would be a 1 (since both A and B would be 1s). Thus, the non-deterministic input A renders the output of logic gate 700 non-deterministic.

Thus, the expanded table in FIG. 6 represents the conditions under which the output of logic gate 700 may be non-deterministic due to the logic gate 700 itself experiencing a switching or glitch hazard condition. The table in FIG. 8 represents the conditions under which the output of the logic gate 700 may be non-deterministic due to the inputs to the logic gate 700 being non-deterministic. Using the combination of tables from FIGS. 6 and 8, when X=1, the logic gate 700 itself is in a switching or glitch condition. When Y=1, the output of the logic gate 700 is non-deterministic because its inputs are non-deterministic, i.e. the inputs to the logic gate 700 are non-deterministic because a previous logic gate in the circuit is experiencing a switching or glitch condition. Thus, taking the logical "or" of the X value and Y value provides an indication as to whether the output of the logic gate 700 is deterministic or not based on the logic gate 700 itself experiencing a switching or glitch condition or a previous logic gate experiencing a switching or glitch condition thereby causing one or more inputs to the logic gate 700 being non-deterministic. The C' value is indicative of the result of this logical "or" of the X and Y values. Thus, C' is a "1" if the logic gate itself may be experiencing a switching or glitch hazard condition or if the inputs to the logic gate are non-deterministic.

The combination of the truth tables shown in FIGS. 6 and 8 is referred to herein as a fully expanded truth table for the logic gate. A similar type of fully expanded truth table may be generated for each of an expanded OR gate and an expanded XOR gate. These fully expanded truth tables are shown in FIGS. 9 and 10. FIG. 9 is an exemplary diagram illustrating a fully expanded truth table for an expanded OR gate in accordance with an exemplary embodiment of the present invention. FIG. 10 is an exemplary diagram illustrating a fully expanded truth table for an expanded XOR gate in accordance with an exemplary embodiment of the present invention.

FIGS. 6-10 illustrate how history is important in understanding the behavior of combinatorial logic used in an asynchronous interface. That is, it is important to know whether the output of combinatorial logic is deterministic or not based on not only the possibility that the logic gate itself is experiencing a switching or glitch hazard, but also based on whether or not the inputs to the logic gate are the result of a switching or glitch hazard condition in another logic gate of the combinatorial logic.

Although asynchronous interfaces are not part of traditional timing analysis, they must be sufficiently timed to show any input transition will be free from combinatorial switching and glitch hazards while taking into account clock skew for both the sending and receiving clock domains, and wire delay after some specific period of time. This time period is referred to herein as tAX. Usually tAX is known to be less than the clock cycle time of the receiving clock domain for an asynchronous interface. Since the output of a combinatorial gate can be undefined until tAX has been satisfied under the conditions previously outlined above, if A', B', or C' is activated it must be held for the tAX period.

Figure 11:
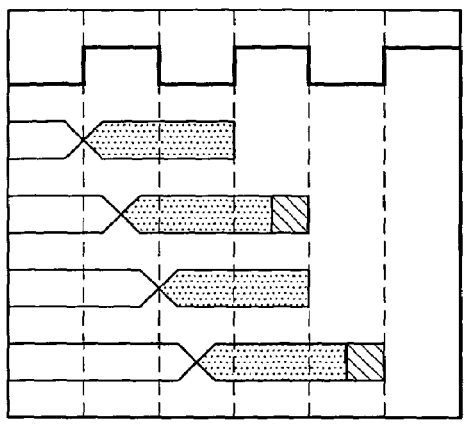
FIG. 11 is an exemplary diagram illustrating how long an output of the expanded gate must be held active.

FIG. 11 is an exemplary diagram illustrating how long an output of the expanded gate must be held active. As shown in FIG. 11, the shaded area of each timing diagram illustrates how long C' must be held active if tAX is known to be no greater than one receive clock period rclk. Although it is only required that C' be held active during the tAX period, it is also valid to hold C' active throughout the lined region as well. This is because the receiving logic can not react to the tAX period ending any sooner than at the starting or ending edge of the receive clock period rclk.

Now that the combinatorial logic truth table has been fully expanded for the asynchronous interface, and the duration of the logic gate can be at an uncertain value, the expanded primitive combinatorial logic gates can be used to build complex networks of logical gates. By connecting the C' output of one of the newly formed expanded logic gates to the appropriate A'/B' input of the next logical gate in the network, the net effect of combinatorial switching and glitch hazards can be detected at the latch input of the receiving latch on the asynchronous interface.

Knowing when and if the inputs to a latch are uncertain, the output of the latch can be overwritten in the model from the normal logical value to an "X" value, where "X" is a symbolic value that simultaneously represents a '1', '0', and neither a '1' or '0' value, when the latch enable pin is activated. This is done by replacing the original latch with an equivalent latch having an additional C' input as shown in FIGS. 12A and 12B.

Figure 12A:
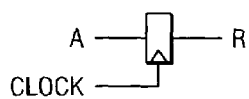
FIGS. 12A and 12B are diagrams illustrating a standard register and an expanded register in accordance with an exemplary embodiment of the present invention.
Figure 12B:
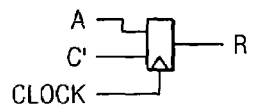

FIGS. 12A and 12B are diagrams illustrating a standard register and an expanded register in accordance with an exemplary embodiment of the present invention. As shown in FIG. 12A, in a standard latch model, the data input A is passed to the output R when the clock input clk is active. However, if the data input value is not DC before the clock becomes active, i.e. the data input value is not in a non-transitional state sufficiently long enough that the input value appears as a static direct current value, the output of the latch may be either meta-stable or the incorrect logic value due to combinatorial logic switching and glitch problems. Since the expanded combinatorial, which has already been used to replace the original logic gates, detects when such switching and glitch hazards exist, that information may be presented on the C' input to the new latch model shown in FIG. 12B. In addition to the hazard information being forwarded to the latch in FIG. 12B, the input A will also be monitored to note if its value is not DC prior to the clock becoming active. If a hazard condition, detected by C', is seen, the result R would become 'X'. If the input A has not become DC prior to the clock becoming active, the output R would be randomly selected from one of the following three conditions: 1) the current value seen on the A input, thus modeling the pass through case seen in asynchronous interfaces, 2) the old value of R, thus modeling the case where the input A was not seen in time for the clock transition, and 3) the normal logical value. Which of the three values will be seen by the actual synthesized logic is not known a priori. Additionally, it is not known if just one of the values will be seen during the simulation. The goal for the simulation is then to verify the logic is correct under all possible conditions. Random selection of one of the valid values has shown to be an effective method for verifying the logic operates correctly under all conditions.

The final step in accurately modeling the asynchronous interface is dealing with the issue of meta-stability. Although latch meta-stability can occur in synchronous logic as well as asynchronous logic alike, the probability of meta-stability occurring and having an impact is significantly greater in asynchronous interfaces. It also is important to note that traditional asynchronous interfaces are not designed to recover from meta-stability. Instead, one or more secondary latches are carefully inserted in the receiving clock domain such that the probability of any logic being affected by meta-stability is approximately equal to the rest of the synchronous design. However, this is not always true especially when one considers typical non-control paths of an asynchronous interface. When the required meta-stability hardening latches are not present and the input to a latch on the interface changes or becomes uncertain during the setup and hold plus clock skew time period then, with the present invention, the output of that latch is overwritten with an 'X' value for the period which the latch could be undergoing meta-stability. Since meta-stability is a phenomenon that will dissipate over time, the latch must have the ability to return to its logical value after the meta-stability time period has expired.

Thus, having developed the expanded logic gates and associated fully expanded truth tables, along with the new latch for latching the value of the C' output, the present invention provides a mechanism for identifying the asynchronous interface logic in an integrated circuit design and then using these new expanded logic gates and latches to replace logic in the asynchronous interface. As mentioned above, the complex logic in an asynchronous interface may be broken down into corresponding combinations of primitive logic elements, i.e. logic gates. These primitive logic gates may then be replaced with corresponding expanded logic gates according to the present invention. In addition, sink latches, i.e. the receiving clock domain latch may be replaced with the expanded latch shown in FIG. 12B. Having replaced these elements, the integrated circuit may be simulated with the additional inputs and outputs such that the C' values stored by the receiving latches may be output for use by the user of the integrated circuit design system.

Figure 13A:
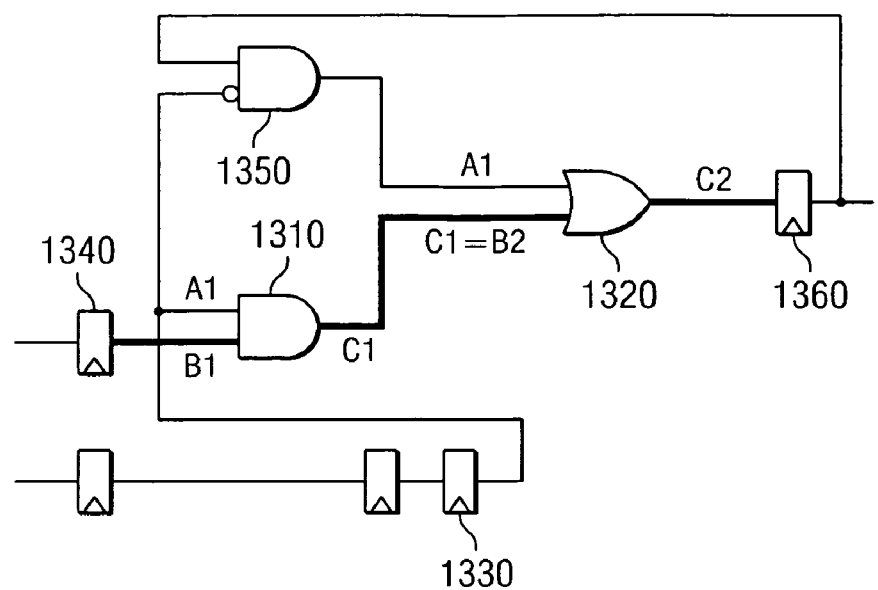
FIGS. 13A and 13B are diagrams illustrating a initial asynchronous interface logic design and an expanded asynchronous interface logic design in accordance with an exemplary embodiment of the present invention.
Figure 13B:
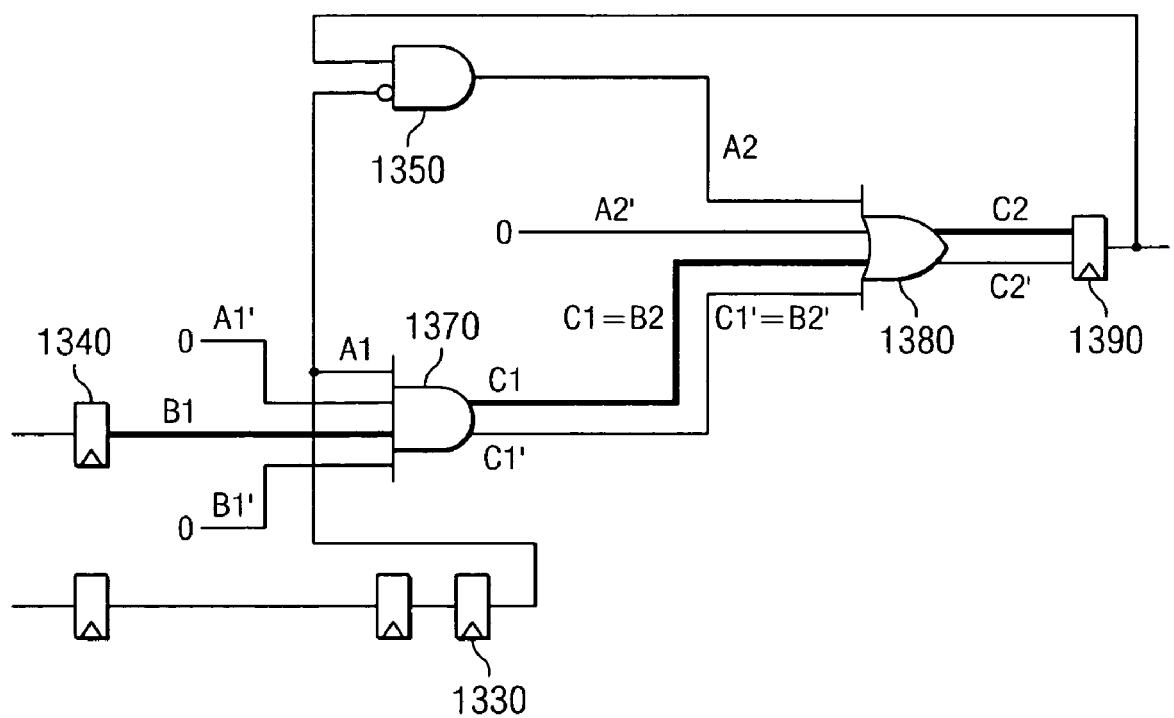

FIGS. 13A and 13B are diagrams illustrating an initial asynchronous interface logic design and an expanded asynchronous interface logic design in accordance with an exemplary embodiment of the present invention. As shown in FIG. 13A, the initial asynchronous interface logic design includes AND gate 1310 and OR gate 1320. Source latch 1330 provides the A input to AND gate 1310 and source latch 1340 provides the B input to AND gate 1310. The output of inverted AND gate 1350 provides the A input to OR gate 1320 and the output of AND gate 1310 provides the B input to OR gate 1320. The sink or receive latch 1360 receive the output from OR gate 1320. The source latch 1330 is clocked by a first clock signal while the sink or receive latch 1360 is clocked by a second clock signal such that two clock domains are present with the asynchronous interface being provided between these clock domains.

With the present invention, the asynchronous interface is identified based on the fact that the logic is between two different clock domains. The logic gates 1310 and 1320 of the asynchronous interface are replaced by the expanded logic gates 1370 and 1380 in accordance with the present invention. In addition, the receive latch 1360 is replaced with a receive latch 1390 that may store the C' output from replaced OR gate 1380. In simulating the circuit shown in FIG. 13B, the fully expanded truth tables for the expanded logic gates 1370 and 1380 are used to determine what the value of C' is from the logic gates 1370 and 1380. Taking the logic "or" of the X and Y values for each of the logic gates 1370 and 1380 provides the C' values as discussed above. The ultimate C' value output by the expanded OR gate 1380 is stored in latch 1390. This C' value may be used to modify the output of latch 1390 from the C output received from the OR gate 1380 to an 'X' value when C is determined to be non-deterministic. In addition, the C' value stored in the receive latch 1390 may be output for use by a user of the integrated circuit design system.

Figure 14:
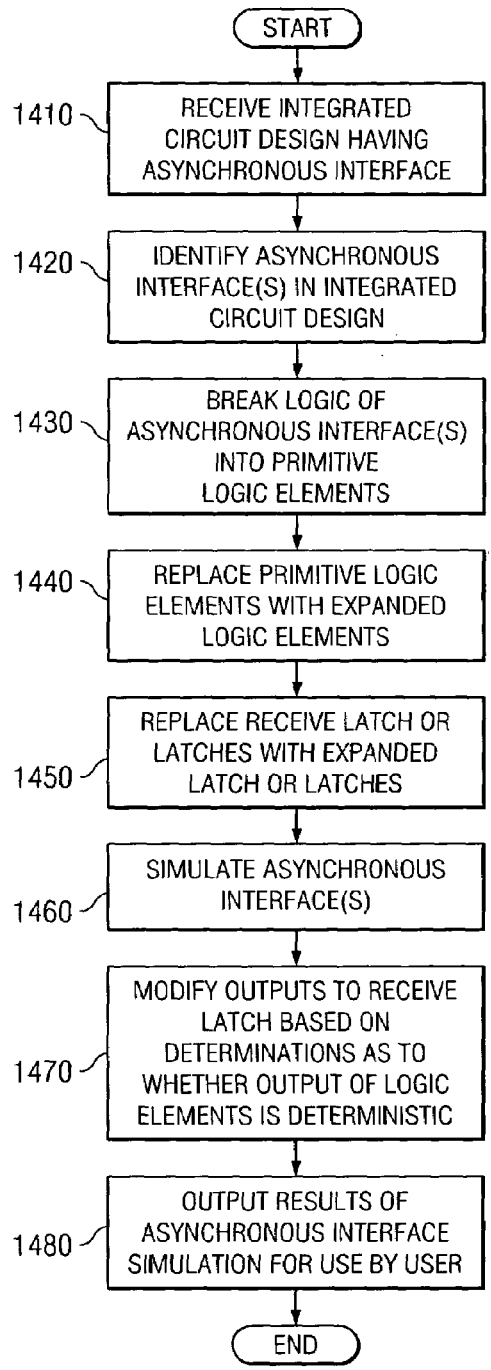
FIG. 14 is a flowchart outlining an exemplary operation of the present invention.

FIG. 14 is a flowchart outlining an exemplary operation of the present invention. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 14, the operation starts by receiving an integrated circuit design having an asynchronous interface (step 1410). The asynchronous interface(s) in the integrated circuit design are identified (step 1420). The logic of the asynchronous interface is then broken down into primitive logic elements (step 1430). The primitive logic elements of the asynchronous interface are replaced by corresponding expanded logic gates (step 1440). The receive latch is then replaced by an expanded latch (step 1450). The asynchronous interface is then simulated (step 1460). Outputs of the replaced logic gates to the receive latch are modified based on a determination as to whether the output is deterministic or not based on the fully expanded truth tables of the replacement expanded logic gates (step 1470). The results of the asynchronous interface simulation, including the C' values stored in the receive latch, are output for use by a user of the integrated circuit design system (step 1480). The operation then terminates.

Thus, the present invention provides a mechanism for accurately modeling an asynchronous interface by taking into consideration clock skew, switching hazards, glitch hazards, asynchronous latch updates, and meta-stability. New expanded logic gates and latches are provided along with corresponding fully expanded truth tables for identifying when inputs to the expanded logic gates are deterministic or non-deterministic and when the outputs of the expanded logic gates are deterministic or non-deterministic based on switching or glitch hazard conditions. These new expanded logic gates and latches may be used with asynchronous interfaces in integrated circuit designs to replace the existing logic to provide a more accurate model of the asynchronous behavior of the asynchronous interface.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for modeling an asynchronous interface, comprising:

identifying logic of the asynchronous interface in an integrated circuit design;

converting the logic of the asynchronous interface into primitive logic elements;

replacing the primitive logic elements with corresponding expanded primitive logic elements, wherein the expanded primitive logic elements include deterministic inputs and deterministic outputs representative of a deterministic or non-deterministic nature of data inputs and data outputs of the expanded primitive logic elements;

replacing latches in the asynchronous interface of the integrated circuit design with expanded latches that receive an additional input indicative of whether a data input to the expanded latch is deterministic or not;

running a simulation of the asynchronous interface using the expanded primitive logic elements to thereby model the asynchronous interface; and generating an output indicating results of running the simulation of the asynchronous interface using the expanded primitive logic elements to thereby model the asynchronous interface.

2. The method of claim 1, wherein the expanded primitive logic elements have associated expanded truth tables that include first information for identifying when a corresponding expanded primitive logic element may experience a switching or glitch hazard condition in the expanded primitive logic element itself.

3. The method of claim 2, wherein the first information includes combinations of the data inputs and transitions of the data inputs of the expanded primitive logic elements that result in a switching or glitch hazard condition of the expanded primitive logic elements.

4. The method of claim 2, wherein the expanded truth tables further include second information for identifying conditions under which outputs of the corresponding expanded primitive logic elements are non-deterministic due to glitch or switching hazard driven inputs from other logic elements.

5. The method of claim 4, wherein the second information includes combinations of the deterministic inputs which result in a deterministic or non-deterministic output of the expanded primitive logic elements.

6. The method of claim 4, wherein the first information includes a first set of values X indicative of whether a corresponding combination of data inputs and their transitions may or may not result in a switching or glitch hazard occurring in the corresponding expanded primitive logic gate, and wherein the second information includes a second set of values Y indicative of whether a corresponding combination of deterministic inputs result in a non-deterministic or deterministic output, and wherein running the simulation of the asynchronous interface includes:

determining whether an output of an expanded primitive logic gate is deterministic or not by taking a logical OR of a current X value and current Y value for the expanded primitive logic gate.

7. The method of claim 1, wherein running the simulation of the asynchronous interface further includes:

providing a deterministic output from the expanded primitive logic gate to the expanded latch indicative of whether or not the data output of the expanded primitive logic gate is deterministic or not, wherein the data output of the expanded primitive logic gate is a data input to the expanded latch.

8. The method of claim 7, further comprising:

determining if the data input to the expanded latch is meta-stable; and replacing a value of an output of the expanded latch with an alternative value if it is determined that the output of the data input to the expanded latch is meta-stable.

9. The method of claim 8, wherein the alternative value is randomly selected from a set of possible alternative values including a current data input value to the expanded latch, an old output of the expanded latch, and a normal logical value.

10. A computer program product in a computer readable medium for modeling an asynchronous interface in a computer, comprising:
   first instructions executable in the computer for identifying logic of the asynchronous interface in an integrated circuit design;
   second instructions executable in the computer for converting the logic of the asynchronous interface into primitive logic elements;
   third instructions executable in the computer for replacing the primitive logic elements with corresponding expanded primitive logic elements, wherein the expanded primitive logic elements include deterministic inputs and deterministic outputs representative of a deterministic or non-deterministic nature of data inputs and data outputs of the expanded primitive logic elements;
   fourth instructions executable in the computer for replacing latches in the asynchronous interface of the integrated circuit design with expanded latches that receive an additional input indicative of whether a data input to the expanded latch is deterministic or not;
   fifth instructions executable in the computer for running a simulation of the asynchronous interface using the expanded primitive logic elements to thereby model the asynchronous interface in the computer; and
   sixth instructions executable in the computer for generating an output indicating results of running the simulation of the asynchronous interface using the expanded primitive logic elements to thereby model the asynchronous interface.

11. The computer program product of claim 10, wherein the expanded primitive logic elements have associated expanded truth tables that include first information for identifying when a corresponding expanded primitive logic element may experience a switching or glitch hazard condition in the expanded primitive logic element itself.

12. The computer program product of claim 11, wherein the first information includes combinations of the data inputs and transitions of the data inputs of the expanded primitive logic elements that result in a switching or glitch hazard condition of the expanded primitive logic elements.

13. The computer program product of claim 11, wherein the expanded truth tables further include second information for identifying conditions under which outputs of the corresponding expanded primitive logic elements are non-deterministic due to glitch or switching hazard driven inputs from other logic elements.

14. The computer program product of claim 13, wherein the second information includes combinations of the deterministic inputs which result in a deterministic or non-deterministic output of the expanded primitive logic elements.

15. The computer program product of claim 13, wherein the first information includes a first set of values X indicative of whether a corresponding combination of data inputs and their transitions may or may not result in a switching or glitch hazard occurring in the corresponding expanded primitive logic gate, and wherein the second information includes a second set of values Y indicative of whether a corresponding combination of deterministic inputs result in a non-deterministic or deterministic output, and wherein the fifth instructions for running the simulation of the asynchronous interface include:
   instructions for determining whether an output of an expanded primitive logic gate is deterministic or not by taking a logical OR of a current X value and current Y value for the expanded primitive logic gate.

16. The computer program product of claim 10, wherein the fifth instructions for running the simulation of the asynchronous interface further include:
   instructions for providing a deterministic output from the expanded primitive logic gate to the expanded latch indicative of whether or not the data output of the expanded primitive logic gate is deterministic or not, wherein the data output of the expanded primitive logic gate is a data input to the expanded latch.

17. The computer program product of claim 16, further comprising:
   instructions executable in the computer for determining if the data input to the expanded latch is meta-stable; and
   instructions executable in the computer for replacing a value of an output of the expanded latch with an alternative value if it is determined that the output of the data input to the expanded latch is meta-stable.

18. A system for modeling an asynchronous interface, comprising:
   means for identifying logic of the asynchronous interface in an integrated circuit design;
   means for converting the logic of the asynchronous interface into primitive logic elements;
   means for replacing the primitive logic elements with corresponding expanded primitive logic elements, wherein the expanded primitive logic elements include deterministic inputs and deterministic outputs representative of a deterministic or non-deterministic nature of data inputs and data outputs of the expanded primitive logic elements;
   means for replacing latches in the asynchronous interface of the integrated circuit design with expanded latches that receive an additional input indicative of whether a data input to the expanded latch is deterministic or not;
   means for running a simulation of the asynchronous interface using the expanded primitive logic elements to thereby model the asynchronous interface; and
   means for generating an output indicating results of running the simulation of the asynchronous interface using the expanded primitive logic elements to thereby model the asynchronous interface.

* * * * *